United States Patent
Ahn et al.

(10) Patent No.: US 6,976,300 B2
(45) Date of Patent: Dec. 20, 2005

(54) INTEGRATED CIRCUIT INDUCTORS

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 323 days.

(21) Appl. No.: 10/100,702

(22) Filed: Mar. 18, 2002

(65) Prior Publication Data

US 2002/0095768 A1 Jul. 25, 2002

Related U.S. Application Data

(62) Division of application No. 09/821,240, filed on Mar. 29, 2001, now Pat. No. 6,357,107, which is a division of application No. 09/350,601, filed on Jul. 9, 1999, now Pat. No. 6,240,622.

(51) Int. Cl.$^7$ .............................................. H01F 41/02
(52) U.S. Cl. ..................... 29/604; 257/421; 257/528; 257/531; 29/605; 29/606; 29/607
(58) Field of Search ....................... 29/604, 605, 606, 29/607, 528; 257/531

(56) References Cited

U.S. PATENT DOCUMENTS

| | | | |
|---|---|---|---|
| 3,553,533 A | 1/1971 | Haberecht | |
| 3,561,110 A | 2/1971 | Fuelner et al. | |
| 3,731,005 A | 5/1973 | Shearman | |
| 3,881,244 A | * 5/1975 | Kendall | 29/602.1 |
| 3,988,764 A | 10/1976 | Cline et al. | |
| 3,996,095 A | 12/1976 | Ahn et al. | |
| 4,560,445 A | 12/1985 | Hoover et al. | |
| 5,047,719 A | 9/1991 | Johnson et al. | |
| 5,227,659 A | * 7/1993 | Hubbard | 257/531 |
| 5,448,822 A | 9/1995 | Wu et al. | |
| 5,801,521 A | 9/1998 | Mizoguchi et al. | |
| 5,875,452 A | 2/1999 | Katayama et al. | |
| 5,956,073 A | 9/1999 | Jin et al. | |
| 6,013,939 A | 1/2000 | El-Sharawy et al. | |
| 6,031,273 A | 2/2000 | Torok et al. | |
| 6,054,750 A | 4/2000 | Imam et al. | |
| 6,069,397 A | 5/2000 | Cornett et al. | |

(Continued)

FOREIGN PATENT DOCUMENTS

| | | |
|---|---|---|
| JP | 403286512 | 12/1991 |
| JP | 06-089811 | 3/1994 |
| JP | 406089976 | 3/1994 |
| JP | 59-232403 | 12/1994 |
| JP | 07-272932 | 10/1995 |
| JP | 09-0902539 | 4/1997 |
| JP | 11-251147 | 9/1999 |
| JP | 411251143 | 9/1999 |

OTHER PUBLICATIONS

Iron oxide powders, *Applications of Surface Science*, 22/23, North–Holland Amsterdam, (1985), pp. 621–630.

(Continued)

*Primary Examiner*—Viet Q. Nguyen
(74) *Attorney, Agent, or Firm*—Schwegman, Lundberg, Woessner & Kluth, P.A.

(57) ABSTRACT

The invention relates to an inductor comprising a plurality of interconnected conductive segments interwoven with a substrate. The inductance of the inductor is increased through the use of coatings and films of ferromagnetic materials such as magnetic metals, alloys, and oxides. The inductor is compatible with integrated circuit manufacturing techniques and eliminates the need in many systems and circuits for large off chip inductors. A sense and measurement coil, which is fabricated on the same substrate as the inductor, provides the capability to measure the magnetic field or flux produced by the inductor. This on chip measurement capability supplies information that permits circuit engineers to design and fabricate on chip inductors to very tight tolerances.

36 Claims, 6 Drawing Sheets

U.S. PATENT DOCUMENTS

| | | | |
|---|---|---|---|
| 6,116,863 A | 9/2000 | Ahn et al. | |
| 6,240,622 B1 | 6/2001 | Ahn et al. | |
| 6,249,039 B1 | 6/2001 | Harvey et al. | |
| 6,357,107 B2 * | 3/2002 | Ahn et al. | 29/604 |
| 6,362,012 B1 | 3/2002 | Chi et al. | |
| 6,373,368 B1 | 4/2002 | Shikama et al. | |
| 6,406,988 B1 | 6/2002 | Chung | |
| 6,420,954 B1 | 7/2002 | Ahn et al. | |
| 6,446,327 B2 * | 9/2002 | Ahn et al. | 29/604 |
| 6,459,135 B1 * | 10/2002 | Basteres et al. | 257/528 |
| 6,459,352 B1 | 10/2002 | Liu et al. | |
| 6,531,945 B1 * | 3/2003 | Ahn et al. | 336/200 |
| 6,538,547 B2 | 3/2003 | Tamezawa et al. | |
| 6,548,365 B2 * | 4/2003 | Basteres et al. | 438/381 |
| 6,573,822 B2 * | 6/2003 | Ma et al. | 336/223 |
| 6,612,019 B2 * | 9/2003 | Ahn et al. | 29/604 |
| 6,636,139 B2 | 10/2003 | Tsai et al. | |
| 6,646,534 B2 * | 11/2003 | Ahn et al. | 336/200 |
| 6,696,912 B2 * | 2/2004 | Ahn et al. | 336/200 |
| 6,701,607 B2 * | 3/2004 | Ahn et al. | 29/604 |
| 6,850,141 B2 | 2/2005 | Ahn et al. | |

OTHER PUBLICATIONS

Dimitrov, D.V., et al., "Stoichiometry and Magnetic Properties of Iron Oxide Films", *Materials Research Society Symposium Proceedings, 494*, (1998), pp. 89–94.

Fujii, E., et al., "Low–temperature preparation and properties of spinel–type iron oxide films by ECR plasma–enhanced metalorganic chemical vapor deposition", *Japanese Journal of Applied Physics, 32(10B)*, (Oct. 1993), pp. 1527–1529.

Ouchi, H., et al., "High rate deposition of iron–oxide thin films by reactive sputtering", *IEEE Transactions on Magnetics, vol. MAG–19, No. 5*, (Sep. 1983), pp. 1980–1982.

Soh, H..T., et al., "High rate deposition of iron–oxide thin films by reactive sputtering", *IEEE Transactions on Magnetics, vol. MAG–19, No. 5*, (Sep. 1983), pp. 1980–1982.

Park, J.Y., et al., "Ferrite–Based Integrated Planar Inductor and Transformers Fabricated at Low Temperature", *IEEE Transactions on Magentics 33(5)*, (Sep. 1997), pp. 3322–3324.

Park, J.Y., et al., "Fully Integrated Micromachined Inductors with Electroplated Anisotropic Magnetic Cores", *Thirteenth Annual Applied Power Electronics Conference and Exposition, vol. 1,* Conference Proceedingss, Anaheim, California, (1998), 379–385.

Macchesney, J.B., et al., "Chemical vapor deposition of iron oxide films for use as semitransparent masks", *Journal of the Electrochemical Society, 118(5)*, (May 1971), pp. 776–781.

Li, J.L., et al., "Preparation of amorphous iron–containing and crystalline iron oxide films by glow discharge and their properties", *Material Science & Engineering, B7,* (Sep. 1990), pp. 5–13.

Lin, J.K., et al., "Properties of RF Sputtered Iron Oxide Thin Films With CoCr and Nb as Dopants", *IEEE Transactions on Magnetics, 21(5)*, (Sep. 1985), pp. 1462–1464.

Domke, M., et al., "Magnetic and electronic properties of thin iron oxidef ilms", *Surface Science, 126*, (Mar. 1983), pp. 727–732.

Ouyang, M., et al., "Structure and Magentic Properties of Iron Oxide Films Deposited by Excimer Laser Ablation of a Metal–Containing Polymer", *Material Research Bulletin, 32(8),* (1997), pp. 1099–1107.

Dhara, S., et al., "Direct Deposti of highly coercive gamma iron oxide thin films for magnetic recording", *Journal of Applied Physics, 74(11),* (Dec. 1993), pp. 7019–7021.

Joshi, S., et al., "Pulsed laser depsotion of iron oxide and ferrite films", Journal of Applied Physics, 64 (10), Abstract–Fourth Joint Magnetism and Magnetic Materials–INTERMAG Conference Vancouver, BC, (NOv. 1988), pp. 5647–5649.

Shigematsu, T., et al., et al., "Magnetic properties of amorphous iron (III) oxide thin films", *Journal de Physique Colloque,* International Conference on the Applications of the Mossbauer Effect, Kyoto, Japan, (Mar. 1979), pp. 153–154.

Itoh, T., et al., "Ferrite plating of Ba–containing iron oxide films using chelated highly alkaline (pH equals 11–13) aqueous solutions", *Japanese Journal of Applied Physics 34(3),* (Mar. 1995), pp. 1534–1536.

Zheng, Y., et al., "Structure and magneitc properties of sputtered iron oxide films", *Proceedings of the International Symposium on Physics of Magnetic Materials,* (1987), pp. 146–149.

Kim, Y.J., et al., "Surface Micromachined Solenoid Inductors for Hig Frquency Applications", *1997 International Symposium on Microelectronics,* (1997), 1–6.

* cited by examiner

INTEGRATED CIRCUIT INDUCTORS

CROSS-REFERENCE TO RELATED APPLICATION(S)

This application is a division of U.S. patent application Ser. No. 09/821,240, filed on Mar. 29, 2001, now U.S. Pat. No. 6,357,107 which is a division of U.S. patent application Ser. No. 09/350,601, filed on Jul. 9, 1999, now issued as U.S. Pat. No. 6,240,622, the specifications of which are incorporated herein by reference.

FIELD OF THE INVENTION

This invention relates to inductors, and more particularly, it relates to inductors used with integrated circuits.

BACKGROUND OF THE INVENTION

Inductors are used in a wide range of signal processing systems and circuits. For example, inductors are used in communication systems, radar systems, television systems, highpass filters, tank circuits, and butterworth filters.

As electronic signal processing systems have become more highly integrated and miniaturized, effectively signal processing systems on a chip, system engineers have sought to eliminate the use of large, auxiliary components, such as inductors. When unable to eliminate inductors in their designs, engineers have sought ways to reduce the size of the inductors that they do use.

Simulating inductors using active circuits, which are easily miniaturized, is one approach to eliminating the use of actual inductors in signal processing systems. Unfortunately, simulated inductor circuits tend to exhibit high parasitic effects, and often generate more noise than circuits constructed using actual inductors.

Inductors are miniaturized for use in compact communication systems, such as cell phones and modems, by fabricating spiral inductors on the same substrate as the integrated circuit to which they are coupled using integrated circuit manufacturing techniques. Unfortunately, spiral inductors take up a disproportionately large share of the available surface area on an integrated circuit substrate.

For these and other reasons there is a need for the present invention.

SUMMARY OF THE INVENTION

The above mentioned problems and other problems are addressed by the present invention and will be understood by one skilled in the art upon reading and studying the following specification. An integrated circuit inductor compatible with integrated circuit manufacturing techniques is disclosed.

In one embodiment, an inductor capable of being fabricated from a plurality of conductive segments and interwoven with a substrate is disclosed. In an alternate embodiment, a sense coil capable of measuring the magnetic field or flux produced by an inductor comprised of a plurality of conductive segments and fabricated on the same substrate as the inductor is disclosed.

DETAILED DESCRIPTION OF PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1A:
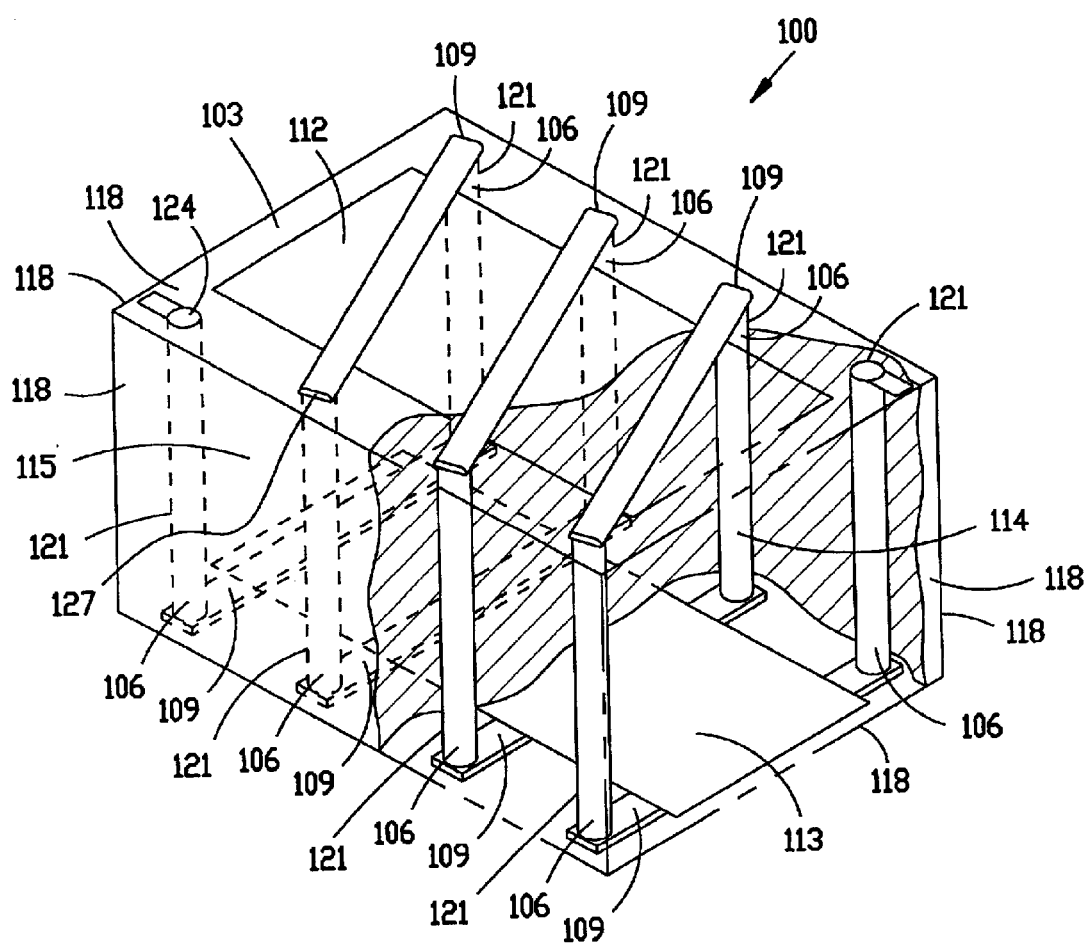
FIG. 1A is a cutaway view of some embodiments of an inductor of the present invention.

FIG. 1A is a cutaway view of some embodiments of inductor 100 of the present invention. Inductor 100 includes substrate 103, a plurality of conductive segments 106, a plurality of conductive segments 109, and magnetic film layers 112 and 113. The plurality of conductive segments 109 interconnect the plurality of conductive segments 106 to form highly conductive path 114 interwoven with substrate 103. Magnetic film layers 112 and 113 are formed on substrate 103 in core area 115 of highly conductive path 114.

Substrate 103 provides the structure in which highly conductive path 114 that constitutes an inductive coil is interwoven. Substrate 103, in one embodiment, is fabricated from a crystalline material. In another embodiment, substrate 103 is fabricated from a single element doped or undoped semiconductor material, such as silicon or germanium. Alternatively, substrate 103 is fabricated from gallium arsenide, silicon carbide, or a partially magnetic material having a crystalline or amorphous structure. Substrate 103 is not limited to a single layer substrate. Multiple layer substrates, coated or partially coated substrates, and substrates having a plurality of coated surfaces are all suitable for use in connection with the present invention. The coatings include insulators, ferromagnetic materials, and magnetic oxides. Insulators protect the inductive coil and separate the electrically conductive inductive coil from other conductors, such as signal carrying circuit lines. Coatings and films of ferromagnetic materials, such as magnetic metals, alloys, and oxides, increase the inductance of the inductive coil.

Substrate 103 has a plurality of surfaces 118. The plurality of surfaces 118 is not limited to oblique surfaces. In one embodiment, at least two of the plurality of surfaces 118 are parallel. In an alternate embodiment, a first pair of parallel surfaces are substantially perpendicular to a second pair of surfaces. In still another embodiment, the surfaces are planarized. Since most integrated circuit manufacturing processes are designed to work with substrates having a pair of relatively flat or planarized parallel surfaces, the use of parallel surfaces simplifies the manufacturing process for forming highly conductive path 114 of inductor 100.

Substrate 103 has a plurality of holes, perforations, or other substrate subtending paths 121 that can be filled, plugged, partially filled, partially plugged, or lined with a conducting material. In FIG. 1A, substrate subtending paths 121 are filled by the plurality of conducting segments 106. The shape of the perforations, holes, or other substrate subtending paths 121 is not limited to a particular shape. Circular, square, rectangular, and triangular shapes are all suitable for use in connection with the present invention. The plurality of holes, perforations, or other substrate subtending paths 121, in one embodiment, are substantially parallel to each other and substantially perpendicular to substantially parallel surfaces of the substrate.

Highly conductive path 114 is interwoven with a single layer substrate or a multilayer substrate, such as substrate 103 in combination with magnetic film layers 112 and 113, to form an inductive element that is at least partially embedded in the substrate. If the surface of the substrate is coated, for example with magnetic film 112, then conductive path 114 is located at least partially above the coating, pierces the coated substrate, and is interlaced with the coated substrate.

Highly conductive path 114 has an inductance value and is in the shape of a coil. The shape of each loop of the coil interlaced with the substrate is not limited to a particular geometric shape. For example, circular, square, rectangular, and triangular loops are suitable for use in connection with the present invention.

Highly conductive path 114, in one embodiment, intersects a plurality of substantially parallel surfaces and fills a plurality of substantially parallel holes. Highly conductive path 114 is formed from a plurality of interconnected conductive segments. The conductive segments, in one embodiment, are a pair of substantially parallel rows of conductive columns interconnected by a plurality of conductive segments to form a plurality of loops.

Highly conductive path 114, in one embodiment, is fabricated from a metal conductor, such as aluminum, copper, or gold or an alloy of a such a metal conductor. Aluminum, copper, or gold, or an alloy is used to fill or partially fill the holes, perforations, or other paths subtending the substrate to form a plurality of conductive segments. Alternatively, a conductive material may be used to plug the holes, perforations, or other paths subtending the substrate to form a plurality of conductive segments. In general, higher conductivity materials are preferred to lower conductivity materials. In one embodiment, conductive path 114 is partially diffused into the substrate or partially diffused into the crystalline structure.

For a conductive path comprised of segments, each segment, in one embodiment, is fabricated from a different conductive material. An advantage of interconnecting segments fabricated from different conductive materials to form a conductive path is that the properties of the conductive path are easily tuned through the choice of the conductive materials. For example, the internal resistance of a conductive path is increased by selecting a material having a higher resistance for a segment than the average resistance in the rest of the path. In an alternate embodiment, two different conductive materials are selected for fabricating a conductive path. In this embodiment, materials are selected based on their compatibility with the available integrated circuit manufacturing processes. For example, if it is difficult to create a barrier layer where the conductive path pierces the substrate, then the conductive segments that pierce the substrate are fabricated from aluminum. Similarly, if it is relatively easy to create a barrier layer for conductive segments that interconnect the segments that pierce the substrate, then copper is used for these segments.

Highly conductive path 114 is comprised of two types of conductive segments. The first type includes segments subtending the substrate, such as conductive segments 106. The second type includes segments formed on a surface of the substrate, such as conductive segments 109. The second type of segment interconnects segments of the first type to form highly conductive path 114. The mid-segment cross-sectional profile 124 of the first type of segment is not limited to a particular shape. Circular, square, rectangular, and triangular are all shapes suitable for use in connection with the present invention. The mid-segment cross-sectional profile 127 of the second type of segment is not limited to a particular shape. In one embodiment, the mid-segment cross-sectional profile is rectangular. The coil that results from forming the highly conductive path from the conductive segments and interweaving the highly conductive path with the substrate is capable of producing a reinforcing magnetic field or flux in the substrate material occupying the core area of the coil and in any coating deposited on the surfaces of the substrate.

Figure 1B:
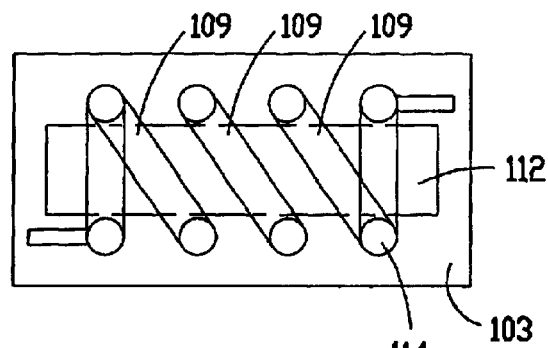
FIG. 1B is a top view of some embodiments of the inductor of FIG. 1A.

FIG. 1B is a top view of FIG. 1A with magnetic film 112 formed on substrate 103 between conductive segments 109 and the surface of substrate 103. Magnetic film 112 coats or partially coats the surface of substrate 103. In one embodiment, magnetic film 112 is a magnetic oxide. In an alternate embodiment, magnetic film 112 is one or more layers of a magnetic material in a plurality of layers formed on the surface of substrate 103.

Magnetic film 112 is formed on substrate 103 to increase the inductance of highly conductive path 114. Methods of preparing magnetic film 112 include evaporation, sputtering, chemical vapor deposition, laser ablation, and electrochemical deposition. In one embodiment, high coercivity gamma iron oxide films are deposited using chemical vapor pyrolysis. When deposited at above 500 degrees centigrade these films are magnetic gamma oxide. In an alternate embodiment, amorphous iron oxide films are prepared by the deposition of iron metal in an oxygen atmosphere ($10^{-4}$ torr) by evaporation. In another alternate embodiment, an iron-oxide film is prepared by reactive sputtering of an Fe target in $Ar+O_2$ atmosphere at a deposition rate of ten times higher than the conventional method. The resulting alpha iron oxide films are then converted to magnetic gamma type by reducing them in a hydrogen atmosphere.

Figure 1C:
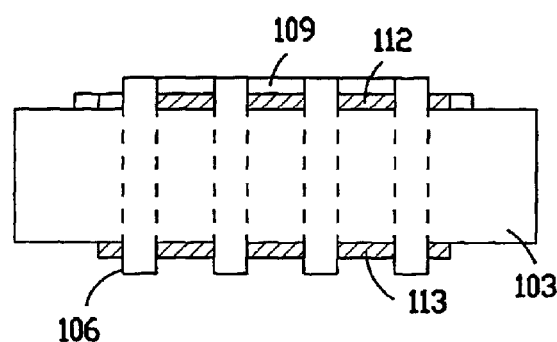
FIG. 1C is a side view of some embodiments of the inductor of FIG. 1A.

FIG. 1C is a side view of some embodiments of the inductor of FIG. 1A including substrate 103, the plurality of conductive segments 106, the plurality of conductive segments 109 and magnetic films 112 and 113.

Figure 2:
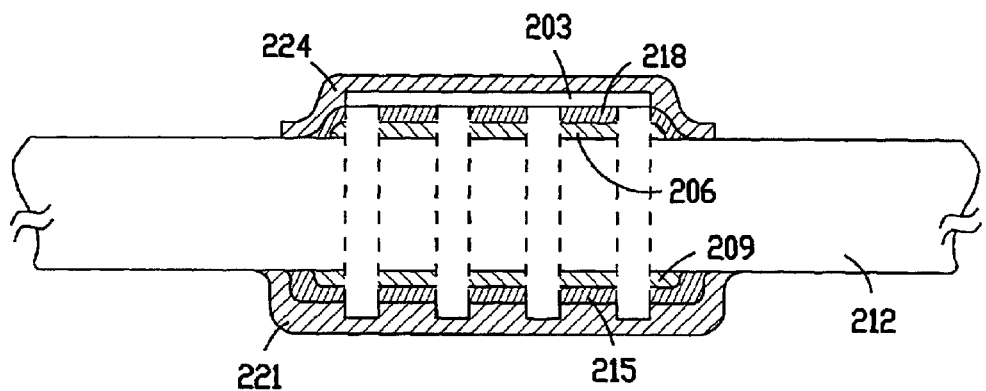
FIG. 2 is a cross-sectional side view of some embodiments of a highly conductive path including encapsulated magnetic material layers.

FIG. 2 is a cross-sectional side view of some embodiments of highly conductive path 203 including encapsulated magnetic material layers 206 and 209. Encapsulated magnetic material layers 206 and 209, in one embodiment, are a nickel iron alloy deposited on a surface of substrate 212. Formed on magnetic material layer layers 206 and 209 are insulating layers 215 and 218 and second insulating layers 221 and 224 which encapsulate highly conductive path 203 deposited on insulating layers 215 and 218. Insulating layers 215, 218, 221 and 224, in one embodiment are formed from an insulator, such as polyimide. In an alternate embodiment, insulating layers 215, 218, 221, and 224 are an inorganic oxide, such as silicon dioxide or silicon nitride. The insulator may also partially line the holes, perforations, or other substrate subtending paths. The purpose of insulating layers 215 and 218, which in one embodiment are dielectrics, is to electrically isolate the surface conducting segments of highly conductive path 203 from magnetic material layers 206 and 209. The purpose of insulating layers 221 and 224 is to electrically isolate the highly conductive path 203 from any conducting layers deposited above the path 203 and to protect the path 203 from physical damage.

The field created by the conductive path is substantially parallel to the planarized surface and penetrates the coating. In one embodiment, the conductive path is operable for creating a magnetic field within the coating, but not above the coating. In an alternate embodiment, the conductive path is operable for creating a reinforcing magnetic field within the film and within the substrate.

Figure 3A:
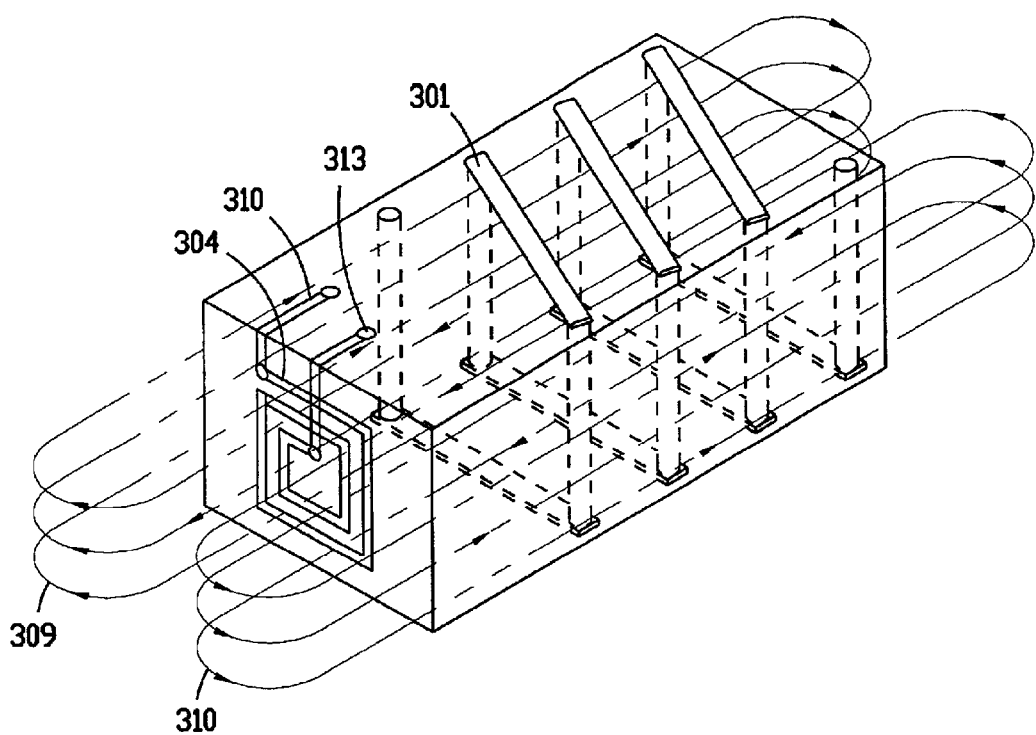
FIG. 3A is a perspective view of some embodiments of an inductor and a spiral sense inductor of the present invention.
Figure 3B:
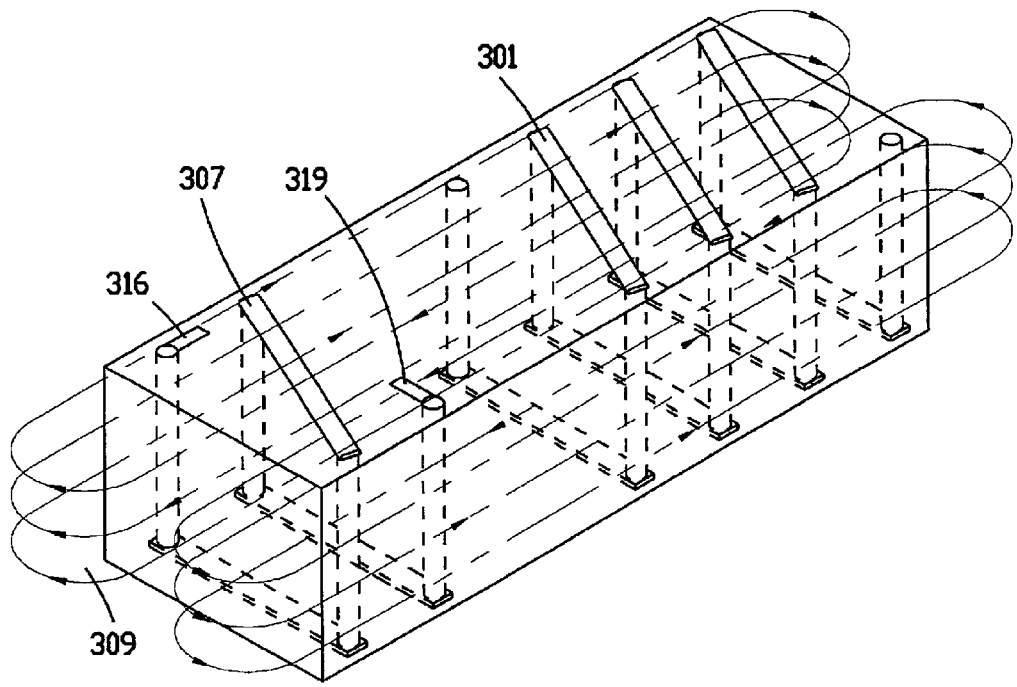
FIG. 3B is a perspective view of some embodiments of an inductor and a non-spiral sense inductor of the present invention.

FIG. 3A and FIG. 3B are perspective views of some embodiments of inductor 301 and sense inductors 304 and 307 of the present invention. In one embodiment, sense inductor 304 is a spiral coil and sense inductor 307 is a test inductor or sense coil embedded in the substrate. Sense inductors 304 and 307 are capable of detecting and measuring reinforcing magnetic field or flux 309 generated by inductor 301, and of assisting in the calibration of inductor 301. In one embodiment, sense inductor 304 is fabricated on one of the surfaces substantially perpendicular to the surfaces of the substrate having the conducting segments, so magnetic field or flux 309 generated by inductor 301 is substantially perpendicular to sense inductor 304. Detachable test leads 310 and 313 in FIG. 3A and detachable test leads 316 and 319 in FIG. 3B are capable of coupling sense inductors 304 and 307 to sense or measurement circuits. When coupled to sense or measurement circuits, sense inductors 304 and 307 are decoupled from the sense or measurement circuits by severing test leads 310, 313, 316, and 319. In one embodiment, test leads 310, 313, 316, and 316 are severed using a laser.

In accordance with the present invention, a current flows in inductor 301 and generates magnetic field or flux 309. Magnetic field or flux 309 passes through sense inductor 304 or sense inductor 307 and induces a current in spiral sense inductor 304 or sense inductor 307. The induced current can be detected, measured and used to deduce the inductance of inductor 301.

Figure 4:
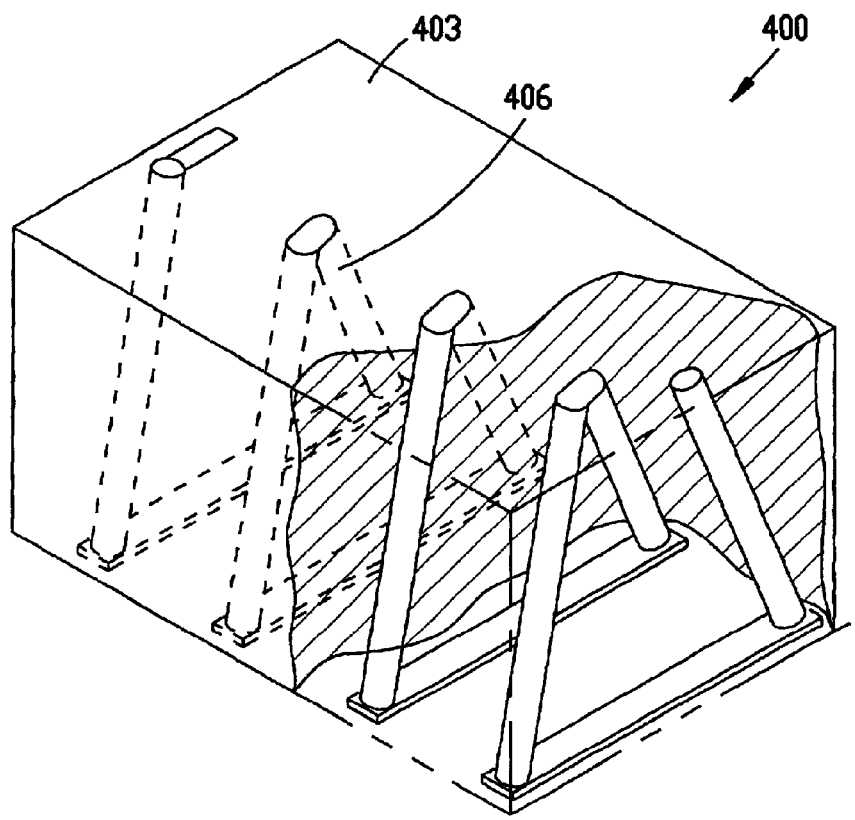
FIG. 4 is a cutaway perspective view of some embodiments of a triangular coil inductor of the present invention.

FIG. 4 is a cutaway perspective view of some embodiments of triangular coil inductor 400 of the present invention. Triangular coil inductor 400 comprises substrate 403 and triangular coil 406. An advantage of triangular coil inductor 400 is that it saves at least a process step over the previously described coil inductor. Triangular coil inductor 400 only requires the construction of three segments for each coil of inductor 400, where the previously described inductor required the construction of four segments for each coil of the inductor.

Figure 5:
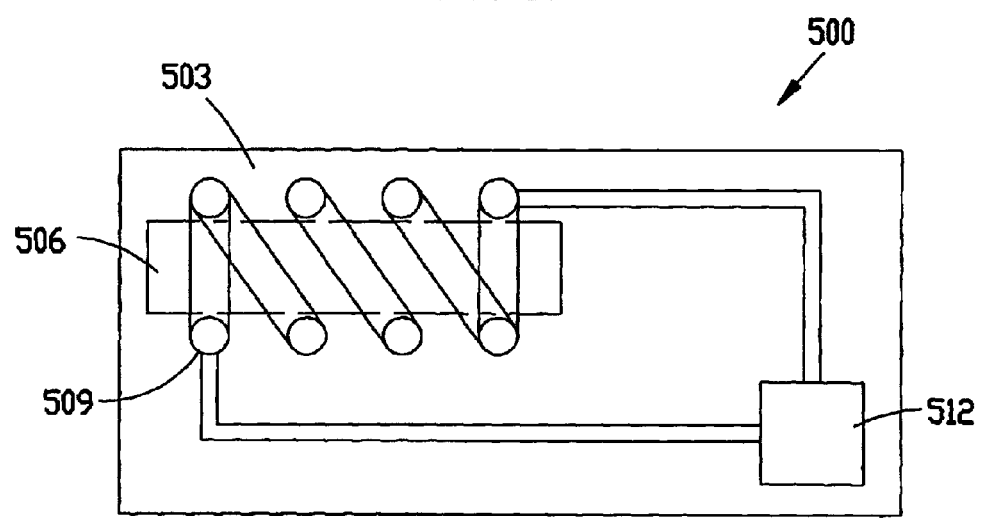
FIG. 5 is a top view of some embodiments of an inductor coupled circuit of the present invention.

FIG. 5 is a top view of some embodiments of an inductor coupled circuit 500 of the present invention. Inductor coupled circuit 500 comprises substrate 503, coating 506, coil 509, and circuit or memory cells 512. Coil 509 comprises a conductive path located at least partially above coating 506 and coupled to circuit or memory cells 512. Coil 509 pierces substrate 503, is interlaced with substrate 503, and produces a magnetic field in coating 506. In an alternate embodiment, coil 509 produces a magnetic field in coating 506, but not above coating 506. In one embodiment, substrate 503 is perforated with a plurality of substantially parallel perforations and is partially magnetic. In an alternate embodiment, substrate 503 is a substrate as described above in connection with FIG. 1. In another alternate embodiment, coating 506 is a magnetic film as described above in connection with FIG. 1. In another alternate embodiment, coil 509, is a highly conductive path as described in connection with FIG. 1.

Figure 6:
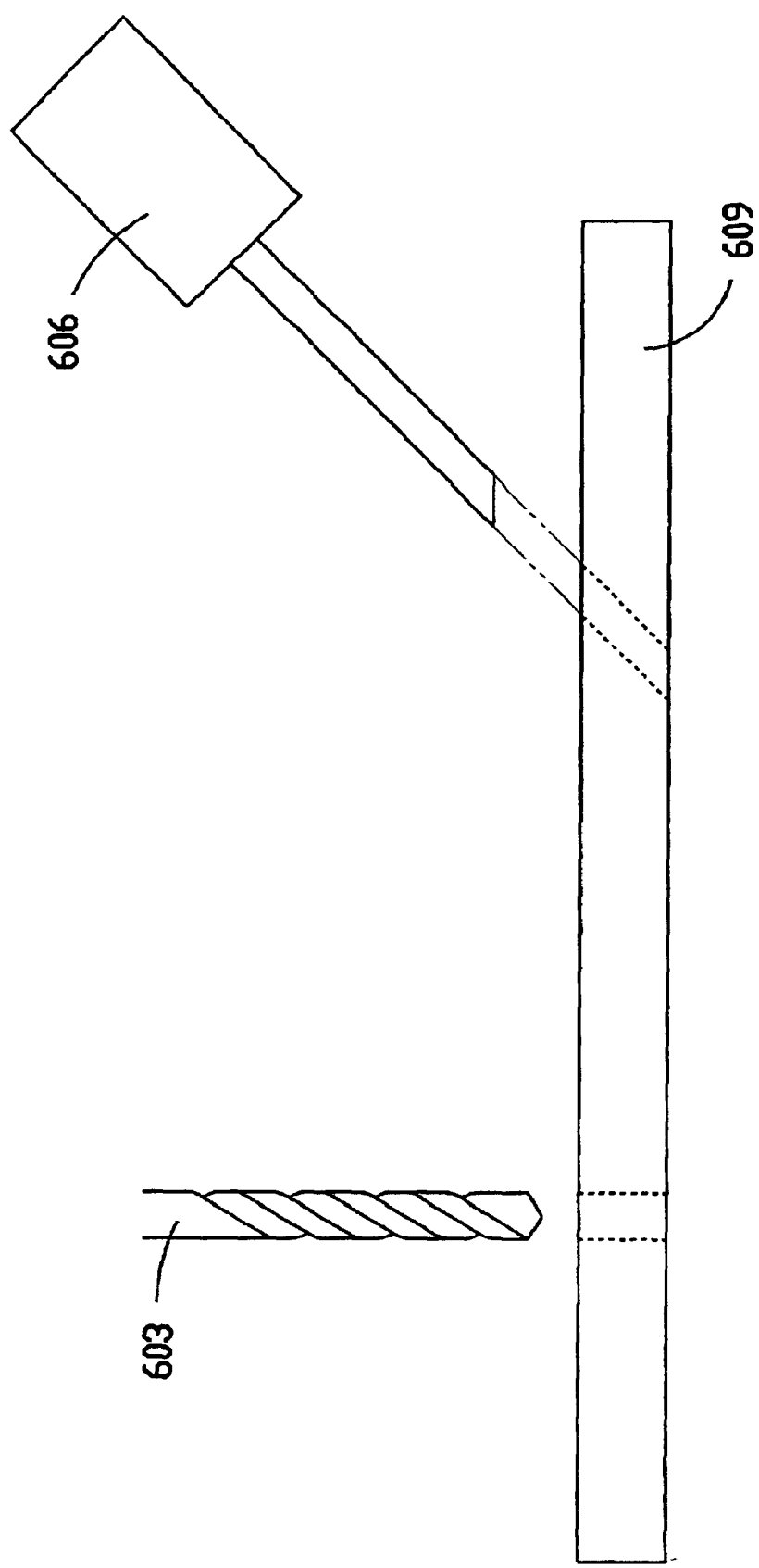
FIG. 6 is diagram of a drill and a laser for perforating a substrate.

FIG. 6 is a diagram of a drill 603 and a laser 606 for perforating a substrate 609. Substrate 609 has holes, perforations, or other substrate 609 subtending paths. In preparing substrate 609, in one embodiment, a diamond tipped carbide drill is used bore holes or create perforations in substrate 609. In an alternate embodiment, laser 606 is used to bore a plurality of holes in substrate 609. In a preferred embodiment, holes, perforations, or other substrate 609 subtending paths are fabricated using a dry etching process.

Figure 7:
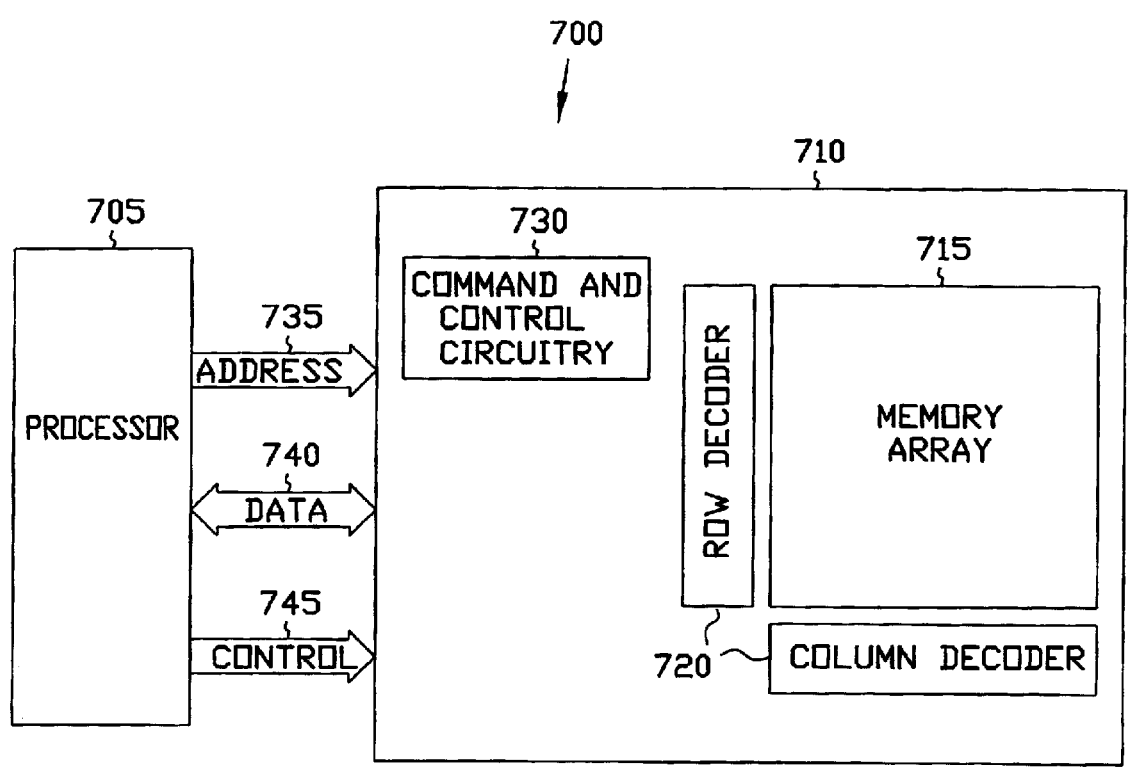
FIG. 7 is a block diagram of a computer system in which embodiments of the present invention can be practiced.

FIG. 7 is a block diagram of a system level embodiment of the present invention. System 700 comprises processor 705 and memory device 710, which includes memory circuits and cells, electronic circuits, electronic devices, and power supply circuits coupled to inductors of one or more of the types described above in conjunction with FIGS. 1A–5. Memory device 710 comprises memory array 715, address circuitry 720, and read circuitry 730, and is coupled to processor 705 by address bus 735, data bus 740, and control bus 745. Processor 705, through address bus 735, data bus 740, and control bus 745 communicates with memory device 710. In a read operation initiated by processor 705, address information, data information, and control information are provided to memory device 710 through busses 735, 740, and 745. This information is decoded by addressing circuitry 720, including a row decoder and a column decoder, and read circuitry 730. Successful completion of the read operation results in information from memory array 715 being communicated to processor 705 over data bus 740.

CONCLUSION

Embodiments of inductors and methods of fabricating inductors suitable for use with integrated circuits have been described. In one embodiment, an inductor having a highly conductive path fabricated from a plurality of conductive segments, and including coatings and films of ferromagnetic materials, such as magnetic metals, alloys, and oxides has been described. In another embodiment, an inductor capable of being fabricated from a plurality of conductors having different resistances has been described. In an alternative embodiment, an integrated test or calibration coil capable of being fabricated on the same substrate as an inductor and capable of facilitating the measurement of the magnetic field or flux generated by the inductor and capable of facilitating the calibration the inductor has been described.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
    a perforated substrate having a circuit formed on the perforated substrate and having a plurality of surfaces where at least one of the plurality of surfaces has a coating; and
    a coil located partially above the coating and the coil operably coupled to the circuit.

2. The integrated circuit of claim 1, wherein the coil has a length and less than about twenty percent of the length of the coil is located above the coating.

3. The integrated circuit of claim 1, wherein the coating comprises a magnetic film.

4. The integrated circuit of claim 1, wherein the coil is partially embedded in the substrate.

5. The integrated circuit of claim 1, wherein the substrate is a silicon wafer.

6. The integrated circuit of claim 1, wherein the coil is formed from a single conductive material.

7. The integrated circuit of claim 1, wherein the coil is formed from two or more conductive materials.

8. The integrated circuit of claim 1, wherein the coil comprises first conductive segments that pass through the substrate and second conductive segments outside of the substrate that connect to the first conductive segments to form the coil.

9. An integrated circuit comprising:
    a substrate with perforations and a plurality of coated surfaces;
    a circuit formed on the substrate; and
    a coil that includes conductive sections formed within the substrate perforations, the coil being located partially above the coated surfaces and operatively coupled to the circuit.

10. The integrated circuit of claim 9, wherein the coil is formed from a single conductive material.

11. The integrated circuit of claim 9, wherein the coil is formed from two or more conductive materials, with the first conductive material constituting the conductive sections formed in the perforations.

12. The integrated circuit of claim 11, further including second conductive sections of a second conductive material that connect to the first conductive sections to form the coil.

13. The integrated circuit of claim 9, wherein the coil has a length, and less than about twenty percent of the length is located above the coated surfaces.

14. The integrated circuit of claim 9, wherein the coated surfaces comprise a magnetic film.

15. An integrated circuit comprising:
    a substrate having first and second regions, the second region having a plurality of perforations connecting first and second parallel sides of the substrate and having a coating;
    a circuit formed in the first region;
    a coil formed in the second region, the coil comprising first conductive sections formed in the perforations and second conductive sections located partially above the coating; and
    wherein the circuit is operatively connected to the coil.

16. The integrated circuit of claim 15, wherein the coating comprises a magnetic material.

17. The integrated circuit of claim 16, further including an insulating layer covering the second conductive sections.

18. The integrated circuit of claim 15, wherein the coil has a triangular cross-section.

19. The integrated circuit of claim 15, wherein the coil has a rectangular cross-section.

20. The integrated circuit of claim 15, wherein the coil is formed from a conductor from the group of conductors comprising: copper, aluminum and gold.

21. An integrated circuit comprising:
    a substrate having a plurality of perforations and a coating on one of a plurality of surfaces;
    a conductive path that passes through the perforations and that partially extends beyond the coating, the conductive path encompassing a portion of the substrate; and
    a circuit operatively connected to the conductive path.

22. The integrated circuit of claim 21, wherein the conductive path comprises a coil formed from one or more conductive metals.

23. The integrated circuit of claim 22, wherein the coil has an inductance and the coating comprises a magnetic material designed to increase the inductance.

24. The integrated circuit of claim 21, wherein the coating comprises a ferromagnetic material.

25. The integrated circuit of claim 21, further including an insulating layer covering the portion of the coil extending beyond the coating.

26. An integrated circuit comprising:
    a substrate having a perforated surface;
    a coil formed in the substrate by passing a conductor through the perforated surface and over first and second surfaces of the substrate;
    a coating formed atop the substrate so as to be surrounded by a portion of the coil; and
    a circuit electrically coupled to the coil.

27. The integrated circuit of claim 26, further including an insulating layer covering the portion of the coil.

28. The integrated circuit of claim 26, wherein the coating includes a magnetic film.

29. The integrated circuit of claim 26, wherein the substrate is a semiconductor.

30. An integrated circuit comprising:
    a substrate having a plurality of surfaces;
    a coating formed on at least one of the surfaces;
    perforations formed in the coating so as to connect first and second surfaces of the plurality of surfaces;
    first conductive segments formed in the perforations;
    second conductive segments formed adjacent the first and second surfaces to connect the first conductive segments to form a coil, the second conductive segments being partially above the coating; and
    a circuit formed on the substrate and operatively connected to the coil.

31. The integrated circuit of claim 30, wherein the coating includes a magnetic film.

32. The integrated circuit of claim 31, wherein the magnetic film and second conductive segments are enclosed in an insulating layer.

33. The integrated circuit of claim 30, further including a sense inductor formed on the substrate and magnetically coupled to the coil.

34. An integrated circuit comprising:
    a semiconductor substrate having two planarized surfaces each having a coating and connected by a plurality of perforations formed over a first region of the substrate;
    a conductive path formed in the substrate first region, the conductive path comprising first conductive elements formed in the perforations and second conductive elements connected to the first conductive elements and residing above the coatings on the first and second surfaces; and
    a circuit connected to the conductive path.

35. The integrated circuit of claim 34, wherein the coating includes a magnetic film.

36. The integrated circuit of claim 35, wherein the magnetic film is surrounded by an insulating layer.

* * * * *

UNITED STATES PATENT AND TRADEMARK OFFICE
CERTIFICATE OF CORRECTION

PATENT NO. : 6,976,300 B2
DATED : December 20, 2005
INVENTOR(S) : Ahn et al.

It is certified that error appears in the above-identified patent and that said Letters Patent is hereby corrected as shown below:

Title page,
Item [56], References Cited, U.S. PATENT DOCUMENTS, after "Haberecht" insert
-- 29/602 --;
delete "Fuelner et al." and insert -- Feulner et al.     29/602 --;
below "3,561,110" insert -- 3,614,554     10/1971     Richardson et al.     317/235R
                       3,691,497     09/1972     Bailey et al.         336/192 --;
after "Shearman" insert -- 179/100.2C --; after "Cline et al" insert -- 357/51 --;
below "3,996,095" insert -- 4,024,565     05/1977     Anthony et al.     357/51 --;
below "4,560,445" insert -- 4,729,510     03/1988     Landis             333/162
                       4,839,659     06/1989     Stern et al.           343/700
                       4,845,452     07/1989     Sasaki et al.          336/200 --;
below "5,047,719" insert -- 5,095,357     03/1992     Andoh et al.       357/51
                       5,177,670     01/1993     Shinohara et al.       361/738 --;
below "5,227,659" insert -- 5,336,921     08/1994     Sundaram et al.    257/531 --;
below "5,448,822" insert -- 5,450,755     09/1995     Saito et al.       73/763
                       5,479,695     01/1996     Grader et al.          29/602.1
                       5,534,837 *   07/1996     Brandt                 336/155
                       5,629,553     05/1997     Ikeda et al.           257/531
                       5,629,838     05/1997     Knight et al.          361/782
                       5,670,415     09/1997     Rust                   427/528
                       5,696,471     12/1997     Fujiwara               333/177
                       5,767,563     06/1998     Imam et al.            257/531 --;
below "5,801,521" insert -- 5,802,702     09/1998     Fleming et al.     29/608
                       5,804,422     09/1998     Shimizu et al.         438/125 --;
after "Katayama et al." insert -- 711/105 --;
below "5,875,452" insert -- 5,898,991     05/1999     Fogel et al.       29/602.1 --;
delete "6,069,397 A     5/2000     Cornett et al." and insert
-- 6,069,397 *     5/2000     Cronett et al.     257/531 --;
below "6,069,397" insert -- 6,094,123     07/2000     Roy                336/200 --;
below "6,116,863" insert -- 6,148,500     11/2000     Krone et al.       29/602.1
                       6,239,683     05/2001     Roessler et al.        336/200 --;
after "Ahn et al." insert -- 29/604 --; after "Harvey et al." insert -- 257/531 --;
below "6,249,039" insert -- 6,291,872     09/2001     Wang et al.        257/531
                       6,303,971     10/2001     Rhee                   257/531
                       6,346,865 *   10/2002     Callewaert et al.      333/182 --;

UNITED STATES PATENT AND TRADEMARK OFFICE
CERTIFICATE OF CORRECTION

PATENT NO. : 6,976,300 B2
DATED : December 20, 2005
INVENTOR(S) : Ahn et al.

It is certified that error appears in the above-identified patent and that said Letters Patent is hereby corrected as shown below:

<u>Title page (cont'd)</u>,
below "6,538,547" insert -- 6,542,060   04/2003   Fedeli   336/174 --;
below "6,850,141" insert
-- 2001/0016976A1   08/2001   Ahn et al.   29   604
   2001/0018794     09/2001   Ahn et al.   29   604
   2001/0022019     09/2001   Ahn et al.   29   604
   2001/0023530     09/2001   Ahn et al.   29   604
   2002/0095773     07/2002   Ahn et al.   29   604
   2002/0095777     07/2002   Ahn et al.   29   604
   2002/0095768A1   07/2002   Ahn et al.   29   604
   2002/0095769A1   07/2002   Ahn et al.   29   604
   2002/0095770A1   07/2002   Ahn et al.   29   604
   2002/0095771A1   07/2002   Ahn et al.   29   604
   2001/0095772A1   07/2002   Ahn et al.   29   604
   2002/0095773A1   07/2002   Ahn et al.   29   604
   2002/0095774A1   07/2002   Ahn et al.   29   604
   2002/0095775A1   07/2002   Ahn et al.   29   604
   2002/0095776A1   07/2002   Ahn et al.   29   604
   2001/0095778A1   07/2002   Ahn et al.   29   604
   2002/0097132A1   07/2002   Ahn et al.   336   221 --.
FOREIGN PATENT DOCUMENTS, below "406089976" insert
-- JP   06-120036   04/1994 --;
delete "JP   09-0902539" and insert -- JP   09-092539 --;
below "411251143" insert -- JP   2000-269059   09/2000 --.
OTHER PUBLICATIONS,
"Iron oxide powders," reference, delete "Iron" and insert -- Kaito, C., et al., Structure of iron oxide films prepared by evaporating various iron --; and after "North-Holland" insert -- , --.
Delete "Soh, H..T., et al., "High rate deposition of iron-oxide thin films by reactive sputtering", IEEE Transactions on Magnetics, vol. MAG-19, No. 5, (Sep. 1983), pp. 1980-1982." and insert
-- Soh, H. T., et al., "Ultra-Low Resistance, Through-Wafer Via (TWV) Technology and its Applications in Three Dimensional Structures on Silicon", Japanese Journal of Applied Physics, 38(4B), (April 1999), pp 284-285. --.
"Park, J.Y., et al.," reference, (first occurrence) delete "Magentics" and insert
-- Magnetics, --.
"Park, J.Y., et al.," reference, (second occurrence) delete "Proceedingss," and insert
-- Proceedings, --.
"Domke, M., et al.," reference, delete "oxidef ilms" and insert -- oxide films --.
"Ouyang, M., et al.," reference, delete "Magentic" and insert -- Magnetic --.

UNITED STATES PATENT AND TRADEMARK OFFICE
CERTIFICATE OF CORRECTION

PATENT NO. : 6,976,300 B2
DATED : December 20, 2005
INVENTOR(S) : Ahn et al.

It is certified that error appears in the above-identified patent and that said Letters Patent is hereby corrected as shown below:

<u>Title page (cont'd)</u>,
"Dhara, S., et al.," reference, delete "Deposti" and insert -- Deposit --.
"Joshi, S., et al.," reference, delete "depsotion" and insert -- deposition --; delete "NOv." and insert -- Nov. --.
"Shigematsu, T., et al.," reference, after "et al.," delete "et al.,".
"Itoh, T., et al.," reference, after "Physics" insert -- , --.
"Zheng, Y., et al.," reference, delete "magneitc" and insert -- magnetic --.
"Kim, Y.J., et al.," reference, delete "Hig Frquency" and insert -- High Frequency --.
Insert -- Ahn, Chong H., et al., "A fully integrated planar toroidal inductor with a micromachined nickel-iron magnetic bar", IEEE Transactions on Components, Packaging, and Manufacturing Technology, Part A - Vol. 17, No. 3, (September 1994), 463-469. --.

Signed and Sealed this

Twenty-fifth Day of April, 2006

JON W. DUDAS
*Director of the United States Patent and Trademark Office*